United States Patent [19]

Iida

[11] Patent Number: 4,845,383

[45] Date of Patent: Jul. 4, 1989

[54] HIGH FREQUENCY VOLTAGE COMPARATOR CIRCUIT

[75] Inventor: Tetsuya Iida, Yokohama, Japan

[73] Assignee: Tokyo Shibaura Denki Kabushiki Kaisha, Kawasaki, Japan

[21] Appl. No.: 480,002

[22] Filed: Mar. 29, 1983

[30] Foreign Application Priority Data

Mar. 31, 1982 [JP] Japan .................................. 57-51369

[51] Int. Cl.$^4$ ...................... H03K 5/24; H03K 17/693
[52] U.S. Cl. ..................................... 307/355; 307/353; 307/240; 307/243; 341/136; 341/158
[58] Field of Search ............... 307/240, 243, 352, 353, 307/355, 362, 364; 328/147, 151; 330/9; 340/347 SH, 347 NT

[56] References Cited

U.S. PATENT DOCUMENTS

| | | | |
|---|---|---|---|
| 3,638,129 | 1/1972 | Pryor | 330/9 |
| 3,676,702 | 7/1972 | McGrogan, Jr. | 307/235 |
| 3,818,246 | 6/1974 | Hellwarth | 330/9 X |
| 3,848,139 | 11/1974 | Holt, Jr. | 307/355 |
| 4,097,753 | 6/1978 | Cook et al. | 307/359 |
| 4,191,900 | 3/1980 | Redfern et al. | 307/355 |
| 4,197,472 | 4/1980 | Aoki et al. | 307/355 |
| 4,211,942 | 7/1980 | Aoki et al. | 307/355 |
| 4,237,390 | 12/1980 | Buurma | 307/362 |
| 4,316,105 | 2/1982 | Fowler | 307/362 |

FOREIGN PATENT DOCUMENTS 2855584 8/1979 Fed. Rep. of Germany .

OTHER PUBLICATIONS

Dingwall, "Monolithic Expandable 6 Bit 20 MHz CMOS/SOS A/D Converter"; IEEE JSSC, vol. SC-14, No. 6, pp. 926-932; 12/1979.

*Primary Examiner*—Larry N. Anagnos
*Attorney, Agent, or Firm*—Finnegan, Henderson, Farabow, Garrett & Dunner

[57] ABSTRACT

A voltage comparator circuit that is useful in A/D converters and D/A converters. The circuit comprises a comparison capacitor, a holding capacitor and input switching transistors. The holding capacitor holds the comparison voltage applied to it from the input switching transistors through the comparison capacitor. Therefore, the circuit can perform accurate voltage comparison even if the input voltages are sampled at a high sampling frequency.

6 Claims, 8 Drawing Sheets

(LOW FREQUENCY)

(HIGH FREQUENCY)

(LOW FREQUENCY)

(HIGH FREQUENCY)

F I G. 14A
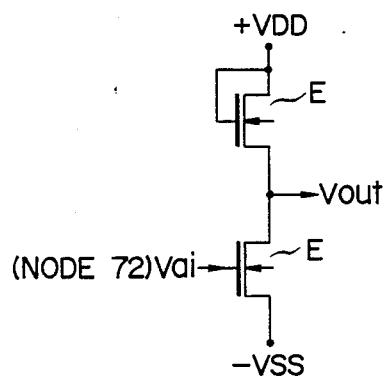
F I G. 14B
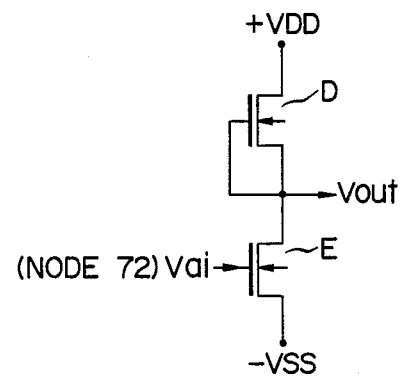
F I G. 14C
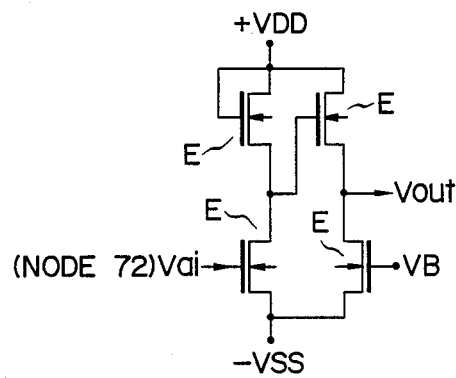
F I G. 14D
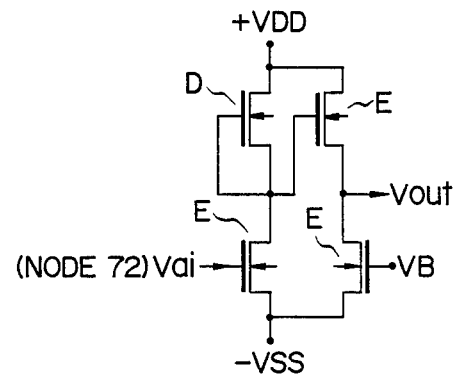

HIGH FREQUENCY VOLTAGE COMPARATOR CIRCUIT

BACKGROUND OF THE INVENTION

This invention relates to a voltage comparator circuit which is useful when utilized in A/D converters as well as D/A converters.

Voltage comparator circuits are well known in the art. They are disclosed in, e.g., "Monolithic Expandable 6 Bit 20 MHz CMOS/SOS A/D Converter" in Journal of S.S.C. of IEEE, 1979, Vol. SC-14, and U.S. Pat. No. 3,676,702 to McGrogan, Jr. entitled "Comparator Circuit".

One example of a known voltage comparator circuit will be explained with reference to FIG. 1 through FIG. 5.

FIG. 1 is a circuit diagram of a conventional voltage comparator circuit. FIG. 2 shows the waveforms of clock signals $\phi_1$ and $\phi_2$ for controlling the circuit shown in FIG. 1. In the circuit, when the clock signals $\phi_1$ and $\phi_2$ are supplied to a transfer gate, or transistor switching circuit, 1, the switching circuit 1 is conducting if the clock signals $\phi_1$ and $\phi_2$ have logic levels "0+ ($-V_{SS}$) and "1" ($=V_{DD}$), respectively. An input signal $V_{in2}$ being supplied to the switching circuit 1 is then transferred to a node 2. Hence, voltage $V_C$ at the node 2 rises to the voltage of the input signal $V_{in2}$; $V_C = V_{in2}$. The switching circuit 1 is comprised of an N-channel MOS transistor and a P-channel MOS transistor. At the same time, when the clock signals $\phi_1$ and $\phi_2$ are supplied to a witching circuit 4, the switching circuit is conducting accordingly. The output voltage $V_{out}$ from an amplifier 6 is fed back to a node 5.

The amplifier 6 has input/output transfer characteristics as illustrated in FIG. 3, wherein the input voltage $V_i$ and output voltage $V_{out}$ are plotted on an abscissa and an ordinate, respectively. In FIG. 3, curve A represents the input/output transfer characteristics of the amplifier 6, and line B denotes the DC feedback characteristic which the amplifier 6 exhibits when its input/output terminals are short-circuited. A potential $V_i$ at the node 5 shown in FIG. 1 is therefore defined by the intersection of curve A and line B; $V_i = V_{op} = V_{out}$. The input voltage $V_i$ for the amplifier 6 which is equal to $V_{op}$ will hereinafter be referred to as the "voltage of operating point".

When the clock signals $\phi_1$ and $\phi_2$ have logic levels "1" ($+V_{DD}$) and "0" ($-V_{SS}$), respectively, both the switching circuits 1 and 4 are non-conducting and a switching circuit 8 is conducting. An input voltage $V_{in1}$ is then applied to the node 2 and voltage $V_C$ at the node 2 changes to $V_{in1}$. The potential difference, or the voltage between the ends of a capacitor 10 remains unchanged because the charge stored in the capacitor 10 is constant. As a result, the potential $V_i$ at the noted 5 changes by the difference voltage at the node 2, i.e. ($V_{in1} - V_{in2}$). Therefore, the potential $V_i$ at the node 5 is given as follows:

$$V_i = (V_{in1} - V_{in2}) + V_{op}.$$

The output voltage $V_{out}$ of the amplifier 6 is expressed by the following equation, where K is the gain of the amplifier 6 (K<0):

$$V_{out} = K(V_{in1} - V_{in2}) + V_{op} \quad (1)$$

In other words, the output voltage $V_{out}$ is obtained from the amplifier 6 by amplifying the difference voltage between voltages $V_{in1}$ and $V_{in2}$.

FIGS. 4 and 5 show the waveforms representing the output from the voltage comparator circuit of FIG. 1. FIGS. 4 and 5 each show not only the waveform "L" of the clock signal $\phi_1$ but also the waveform "H" of an ideal output from the amplifier. The "ideal output" is represented by an ideal curve I which satisfies equation (1). As shown in FIGS. 4 and 5, the output voltage $V_{out}$ is set to $V_{op}$ whenever the level of the clock signal $\phi_1$ falls to logical "0" level. Therefore, the output voltage $V_{out}$ will have an ideal curve I if the clock signal $\phi_1$ has a relatively low frequency, as illustrated in FIG. 4. The negative going edge of the output waveform H can sufficiently return to the voltage $V_{op}$, resulting in satisfactory voltage comparison. Conversely, if the clock signal $\phi_1$ has a relatively high frequency, as shown in FIG. 5, the output voltage $V_{out}$ will not have the ideal curve I. In other words, in a lower frequency range the output voltage of the amplifier 6 can trace the rising and falling edges of the input voltage to the amplifier 6, but in a higher frequency range it cannot. Therefore, the maximum sampling frequency used in voltage comparison is limited. It should be noted that the frequency of a sampling clock signal $\phi_1$ shown in FIG. 5 is twice as high as that of the sampling clock signal $\phi_1$ shown in FIG. 4, and the overall period of the sampling pulse $\phi_1$ in FIG. 5 is equal to approximately a half period of that in FIG. 4.

Although not shown in FIG. 1, the amplifier 6 is of the type which has a large capacitance at its output. Hence, the low frequency output signal from the amplifier 6 has a rise time long enough to achieve a satisfactory voltage comparison. In contrast, the polarity of the high frequency output signal may be inverted before it reaches a predetermined peak value, inevitably resulting in an inaccurate voltage comparison.

In the conventional circuit of FIG. 1, the low frequency voltage gain of the amplifier 6 varies according to a high sampling frequency. If the amplifier 6 is to have a gain large enough to achieve a satisfactory voltage comparison, the upper limit of its frequency band must be raised to about the level of the sampling frequency.

SUMMARY OF THE INVENTION

It is therefore an object of the present invention to provide a voltage comparator circuit which can accurately compare input voltages, obtaining a sufficiently large voltage gain, even if a sampling clock signal of high frequency is used.

The voltage comparator circuit according to the present invention comprises first and second transistor switching means whose current paths receive at one end first and second input voltages, respectively, and are connected at the other end to each other to define a first node and whose gates receive first and second clock signals, respectively, said first and second transistor switching means alternately delivering the first and second input voltage to said first node in synchronism with the first and second clock signals, respectively; generating means including an operating point voltage generator and third transistor switching means whose current path is connected between said operating point voltage generator and a first capacitive element connected to said first node, and which delivers an operating point voltage from said operating point voltage generator to said first capacitive element in synchronism with said first clock signal; and holding means including a second capacitive element and a fourth transistor switching means whose gate is to receive said second clock signal and whose current path is connected between said second capacitive element and a second node where said third transistor switching means is connected to said first capacitive element, said holding means being designed to hold the difference between said first and second input voltages and to apply the same to amplifying means in synchronism with said second clock signal.

The comparator circuit of the invention can amplify the difference between two input voltages and can also hold the amplified difference voltage. Its output voltage can therefore have an ideal curve even if a sampling clock signal of high frequency is used. The low frequency voltage gain of the comparator circuit can thus be maintained.

BRIEF DESCRIPTION OF THE DRAWINGS

The invention is best understood by reference to the accompanying drawings, of which:

FIG. 14A through FIG. 14G are circuit diagrams of the amplifiers used in the circuits of FIGS. 6 to 9;

DETAILED DESCRIPTION OF THE PREFERRED EMBODIMENTS

Figure 1:
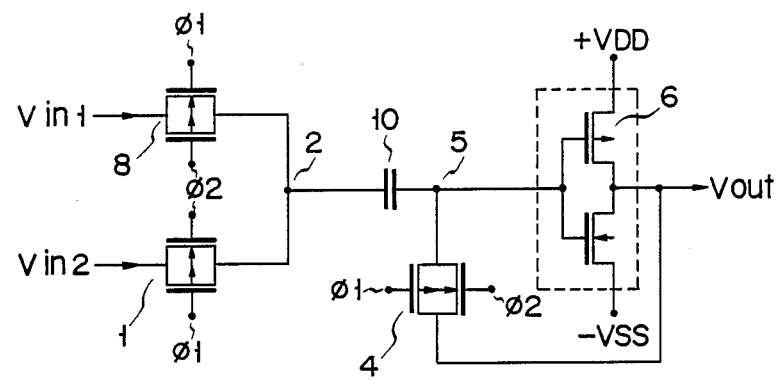
FIG. 1 is a circuit diagram of a conventional voltage comparator circuit.
Figure 2:
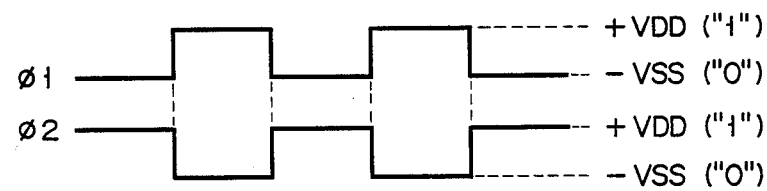
FIG. 2 shows the waveforms of clock signals $\phi_1$ and $\phi_2$ which are supplied to the comparator circuit of FIG. 1.
Figure 3:
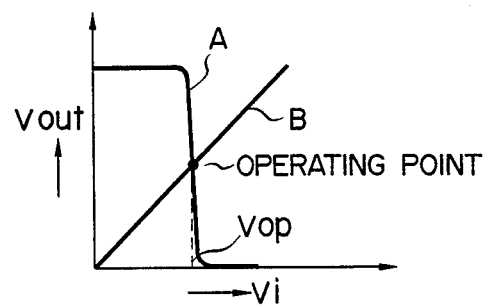
FIG. 3 is a graphic representation of the input/output transfer characteristic of the amplifier used in the comparator circuit of FIG. 1.
Figure 4:
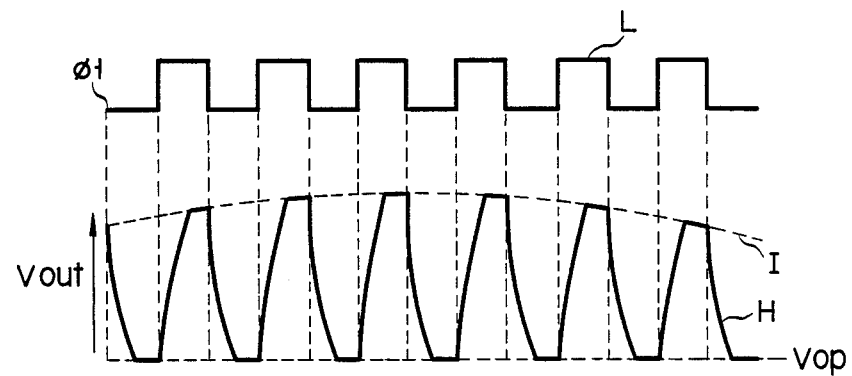
FIG. 4 shows the waveform of the output voltage from the amplifier and the waveform of a clock signal $\phi_1$ of low frequency.
Figure 5:
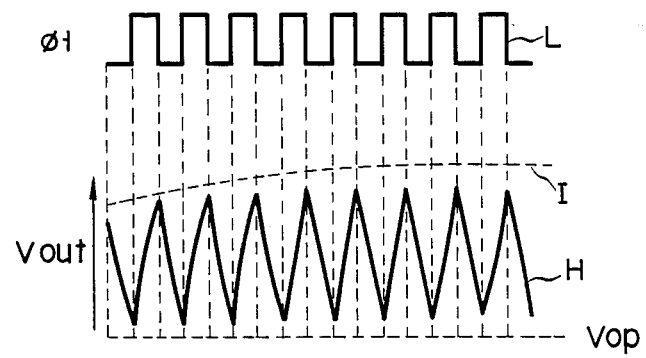
FIG. 5 shows the waveform of the output voltage from the amplifier and the waveform of a clock signal $\phi_1$ of high frequency.
Figure 6:
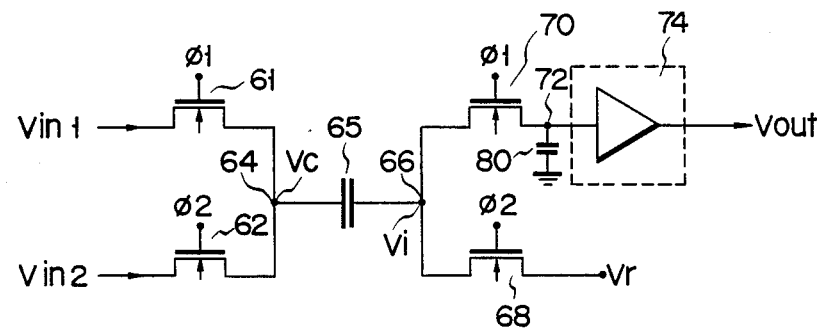
FIG. 6 through FIG. 9 are circuit diagrams of the preferred embodiments of the present invention.
Figure 7:
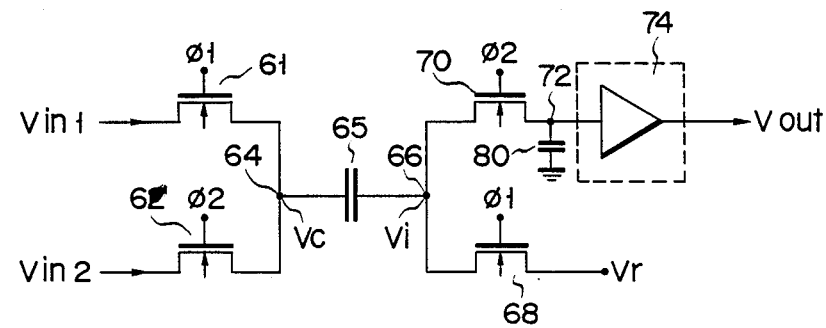
Figure 8:
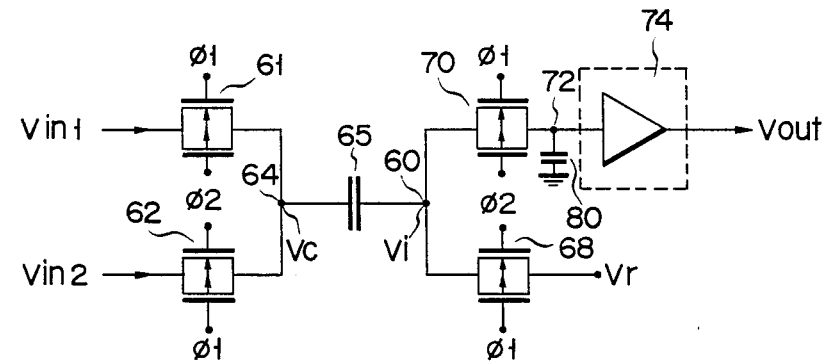
Figure 9:
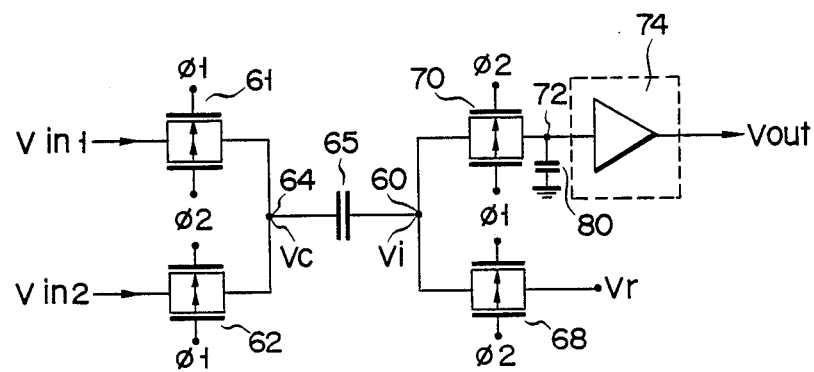
Figure 10:
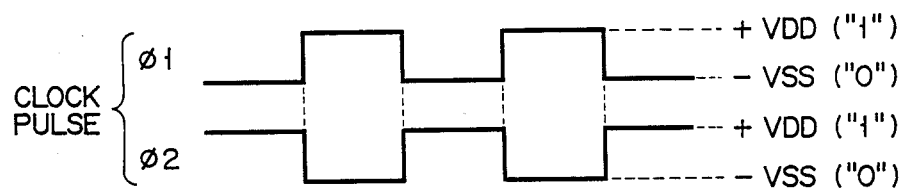
FIGS. 10 and 11 show the waveforms of the clock signals $\phi_1$ and $\phi_2$ used in the circuits of FIGS. 6 to 9.
Figure 11:
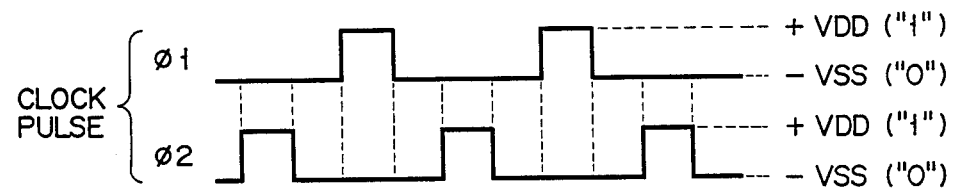

FIGS. 6 to 9 are circuit diagrams of voltage comparator circuits according to the present invention. The circuits of FIGS. 6 and 7 each comprise four switches which are individual N-channel MOS transistors. Two of these transistor switches are controlled by a clock signal $\phi_1$, and the remaining two switches are controlled by a clock signal $\phi_2$. The N-channel MOS transistors which individually comprise the transistor switches may of course be replaced by individual P-channel MOS transistors. The circuits of FIGS. 8 to 9 each comprise four switches, each of the four switches comprising two individual CMOS transistors. Two of these CMOS transistor switches are controlled by a clock signal $\phi_1$, and the remaining two CMOS transistor switches are controlled by a clock signal $\phi_2$. FIG. 10 shows the waveforms of clock signals $\phi_1$ and $\phi_2$ supplied to the circuits of FIGS. 6 and 7, and FIG. 11 shows the waveforms of clock signals $\phi_1$ and $\phi_2$ supplied to the circuits of FIGS. 8 and 9.

The voltage comparator circuit shown in FIG. 6 comprises a first N-channel MOS transistor 61 and a second N-channel MOS transistor 62. The current paths of both transistors 61 and 62 are connected to receive input voltages $V_{in1}$ and $V_{in2}$, respectively, at one end and connected to each other at the other end (a first node 64). A clock signal $\phi_1$ is supplied to the gate of the first N-channel MOS transistor 61, and a clock signal $\phi_2$ is supplied to the gate of the second N-channel transistor 62. The circuit of FIG. 6 further comprises a capacitor 65, a third N-channel MOS transistor 68 and a fourth N-channel MOS transistor 70. The current paths of the transistors 68 and 70 are connected at one end (a second node 66). The capacitor 65 is connected between the first node 64 and the second node 66. The other end of the current path of the third N-channel MOS transistor 68 is connected to receive a reference voltage $V_r$. The other end of the fourth N-channel MOS transistor 70 is connected to the input of an amplifier 74 (a third node 72). A parasitic or actual capacitor 80 is coupled between the third node 72 and ground. It should be understood that although both types of clock signals as shown in FIGS. 10 and 11 are available to control N-channel transistors 61, 62, 68 and 70, it is preferable to use the clock signals shown in FIG. 11.

How the voltage comparator circuit of FIG. 6 operates will now be explained with reference to FIGS. 10, 12 and 13.

When the levels of clock signals $\phi_1$ and $\phi_2$ are $-V_{SS}$ (i.e., a logic level "0+) and $+V_{DD}$ (i.e., logic level "1"), the second N-channel MOS transistor 62 is turned on, while the first N-channel MOS transistor 61 remains off. The voltage $V_C$ at the first node 64 is therefore equal to the second input voltage $V_{in2}$ or $V_{in2}[n]$, i.e., the voltage obtained upon sampling the input voltage $V_{in2}$ n times. The reference voltage $V_r$ is applied to the second node 66 from the third N-channel MOS transistor 68 which is controlled by clock signal $\phi_2$. Potential $V_i$ at the second node 66 becomes equal to reference voltage $V_r$ (i.e., $V_i = V_r$)

When the levels of clock signals $\phi_1$ and $\phi_2$ change to $+V_{DD}$ (logic level "1") and $-V_{SS}$ (logic level "0") respectively, the first transistor 61 and the fourth transistor 70 are turned on, while the second transistor 62 and the third transistor 68 are turned off. The voltage at the first node 64 becomes equal to the second input voltage $V_{in1}$. The potential difference, or the voltage between the both ends of the capacitor 65 remains unchanged. Hence, the potential $V_i$ at the second node 66 changes by the variation of the voltage at the first node 64, i.e., $(V_{in1}[n] - V_{in2}[n])$. Potential $V_{ai}$ at the third node 72 is thus given as follows:

$$V_{ai} = (V_{in1}[n] - V_{in2}[n]) + V_r.$$

Suppose the amplifier 74 has an amplification factor K. The output voltage $V_{out}$ from the amplifier 74 is therefore:

$$V_{out} = K \cdot (V_{in1}[n] - V_{in2}[n]) + V_r.$$

If the reference voltage $V_r$ is set to the voltage of the operating point $V_{op}$ of the amplifier 74, the output voltage $V_{out}$ is expressed as follows:

$$V_{out} = K \cdot (V_{in1}[n] - V_{in2}[n]) + V_{op}.$$

Then when the levels of clock signals $\phi_1$ and $\phi_2$ change back to $-V_{SS}$ (i.e., logic level "0") and $+V_{DD}$ (i.e., logic level "1"), respectively, the transistors 61 and 70 are turned off, while the transistors 62 and 68 are turned on. Voltage $V_{in2}[n+1]$ is therefore obtained upon completion of the [n+1]th sampling of second input voltage $V_{in2}$. Voltage $V_C$ at the first node 64 becomes $V_{in2}[n+1]$. The output voltage $V_{out}$ remains unchanged ($= K \cdot (V_{in1}[n] + V_{in2}[n]) + V_{op}$). This is because the transistor 70 is turned off by the clock signal $\phi_2$ and voltage ($V_{in1}[n] - V_{in2}[n]$) is held by the capacitor 80.

Figure 12:
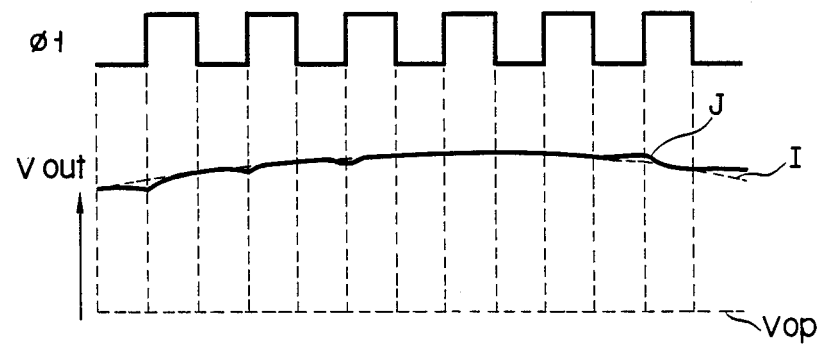
FIG. 12 shows the waveform of the output voltage from an amplifier used in the circuits of FIGS. 6 to 9 and the waveform of a clock signal $\phi_1$ of low frequency.
Figure 13:
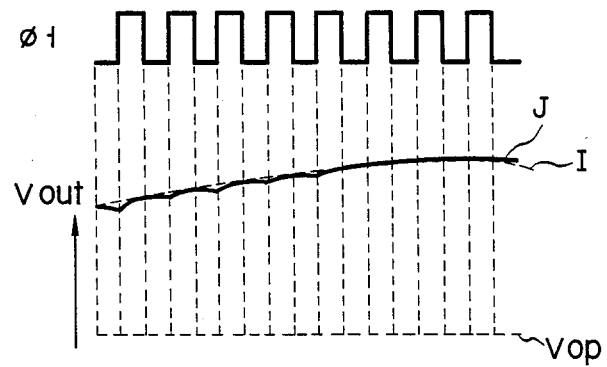
FIG. 13 shows the waveform of the output voltage from an amplifier used in the circuits of FIGS. 6 to 9 and the waveform of a clock signal $\phi_1$ of high frequency.

This value of the output voltage $V_{out}$ remains unchanged until the difference between $V_{in1}[n+1]$ and $V_{in2}[n+1]$ is obtained at the next sampling time, since the fourth transistor 70 is turned on, as shown in FIGS. 12 and 13. In FIG. 12, a broken line represents an ideal curve I of output voltage $V_{out}$ and a solid line indicates the curve J of output voltage $V_{out}$ when the clock signal $\phi_1$ has a low frequency. In FIG. 13, a broken line represents an ideal curve I of output voltage Vout and a solid line indicates the curve J of voltage Vout when the clock signal $\phi_1$ has a high frequency. As is clearly shown in FIG. 13, the output voltage Vout has a waveform which substantially follows ideal curve I even if the sampling frequency, i.e., the frequency of clock signal $\phi_1$, is high, since the sampled input voltages $V_{in1}[n]$ and $V_{in2}[n]$ are held by the capacitor 80 until the next sampling input voltages $V_{in1}[n+1]$ and $V_{in2}[n+1]$ are sampled for the [n+1]th time and the difference between voltages $V_{in1}[n+1]$ and $V_{in2}[n+1]$ is obtained. The circuit of FIG. 6 can correctly compare input voltages $V_{in1}$ and $V_{in2}$, while maintaining its low frequency voltage gain.

The voltage comparator circuit of FIG. 7 is identical with the circuit of FIG. 6, except that clock signal $\phi_1$ and $\phi_2$ are supplied to the gates of a third N-channel MOS transistor 68 and a fourth N-channel MOS transistor 70, respectively. The operation of the circuit shown in FIG. 7 will be described with reference to FIG. 10.

When the levels of clock signals $\phi_1$ and $\phi_2$ are $V_{DD}$ (logic level "1") and $-V_{SS}$ (logic level "0") respectively, a first N-channel MOS transistor 61 and the third N-channel MOS transistor 68 are turned on. Voltage $V_C$ at a first node 64 changes to $V_{in1}[n]$ and potential $V_i$ at a second node 66 is equal to the reference voltage $V_r$. When the levels of clock signals $\phi_1$ and $\phi_2$ change to $-V_{SS}$ and $+V_{DD}$, respectively, the second transistor 62 and the fourth transistor 70 are turned on. Voltage $V_C$ at the first node 64 changes to $V_{in2}[n] - V_{in1}[n]$; and voltage $V_{ai}$ at a third node 72 $V_{in2}[n] - V_{in1}[n] + V_r$. Hence, output voltage $V_{out}$ is given as follows:

$$V_{out} = K \cdot (V_{in2}[n] - V_{n1}[n]) + V_r.$$

If the reference voltage $V_r$ is set to the voltage of the operating point $V_{op}$ of an amplifier 74, then:

$$V_{out} = K \cdot (V_{in2}[n] - V_{in1}[n]) + V_{op}.$$

Like the circuit of FIG. 6, the clock signal $\phi_1$ for the third transistor switch 68 of FIG. 7 can control the sampling comparator input voltages.

The voltage comparator circuit of FIG. 8 is identical with the circuit of FIG. 6, except that CMOS transistor switches 61, 62, 68 and 70 are used in place of the N-channel MOS transistors 61, 62, 68 and 70 shown in FIG. 6. Likewise, the voltage comparator circuit of FIG. 9 is identical with the circuit of FIG. 7, except that CMOS transistor switches 61, 62, 68 and 70 are used in place of the N-channel MOS transistors 61, 62, 68 and 70 shown in FIG. 7. It is necessary to use clock signals $\phi_1$ and $\phi_2$ shown in FIG. 10 in the voltage comparator circuits of FIGS. 8 and 9.

If the CMOS transistor switches 61, 62, 68 and 70 of the circuits of FIGS. 8 and 9 are each comprised of clock signals $\phi_1$ and $\phi_2$ which simultaneously have logic level "0" at sometimes as illustrated in FIG. 11 should be used. If such clock signals $\phi_1$ and $\phi_2$ are used, any two CMOS transistor switches that are controlled by signals $\phi_1$ and $\phi_2$, respectively, will be alternately turned on; they would not be turned on or off at the same time. This ensures a more reliable operation of the circuits shown in FIGS. 8 and 9.

Figure 14E:
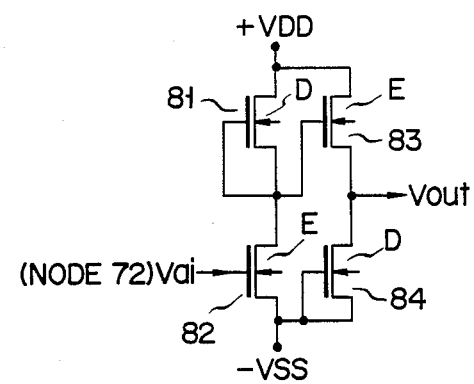
Figure 14F:
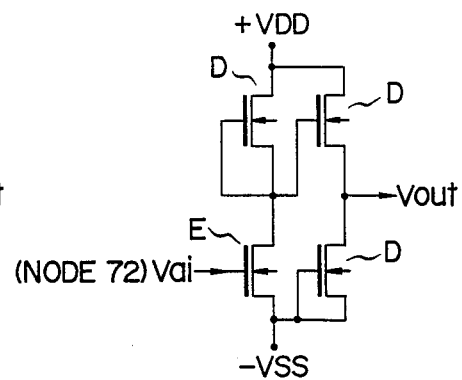
Figure 14G:
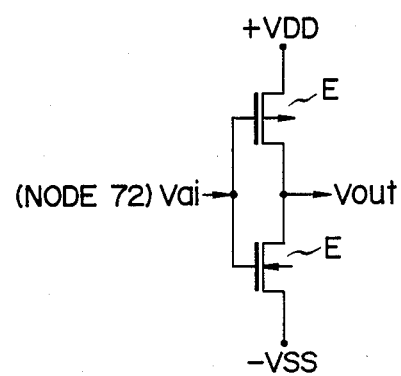

FIGS. 14A to 14G show amplifiers any of which may be used as the amplifiers 74 of the circuits shown in FIGS. 6 to 9. The amplifiers of FIGS. 14A to 14F are each comprised of N-channel MOS transistors. In FIGS. 14A to 14F, E designates an enhancement transistor, D represents a depletion transistor, and $V_B$ denotes a DC bias voltage. The amplifier of FIG. 14F is comprised of CMOS transistors, i.e., two enhancement transistors E. The N-channel MOS transistors of the amplifiers shown in FIGS. 14A to 14F may be replaced by P-channel MOS transistors.

The amplifiers of FIGS. 14A to 14F are well known in the art. For the sake of simplicity, only the amplifier of FIG. 14E will be explained in detail.

As shown in FIG. 14E, the amplifier comprises four transistors 81, 82, 83 and 84. The first transistor 81 and the fourth transistor 84 are depletion transistors, and the second transistor 82 and the third transistor 83 are enhancement transistors. The current path of the first transistor 81 is connected in series to that of the second transistor 82, forming an E/D inverter. The gate of the second transistor 82 is connected to the third node 72 (FIGS. 6 to 9) to receive the input voltage $V_{ai}$. The current path of the third transistor 83 is connected in series to that of the fourth transistor 84. The gate of the third transistor 83 is connected to the junction point between the current paths of the transistors 81 and 82. Output voltage $V_{out}$ of the amplifier is to be delivered from the junction point between the current paths of the transistors 83 and 84. The series circuit of the transistors 83 and 84 is connected in parallel to the series circuit of the transistors 81 and 82.

Figure 15A:
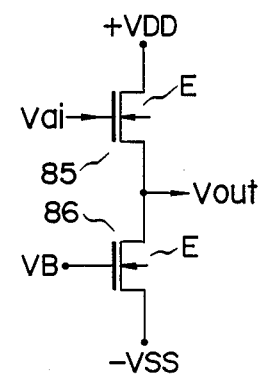
FIG. 15A through FIG. 15C are circuit diagrams of amplifiers which may be used in the circuits of FIGS. 6 to 9.
Figure 15B:
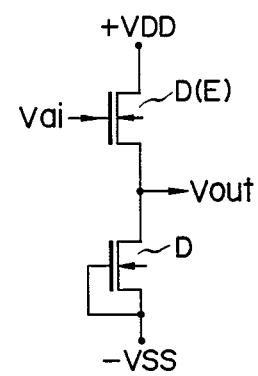
Figure 15C:
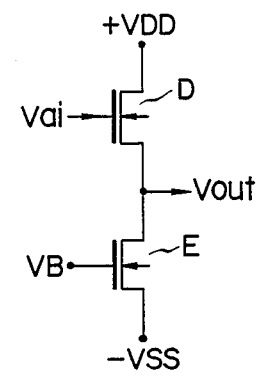

FIGS. 15A to 15C show source followers which may be used in place of the amplifiers illustrated in FIGS. 14A to 14G. The source follower type amplifiers of FIGS. 15A to 15C are each comprised of N-channel MOS transistors. In FIGS. 15A to 15C, E denotes an enhancement transistor, D indicates a depletion transistor, and $V_B$ designates a DC bias voltage. The source follower type amplifiers shown in these figures are well known in the art. Therefore, only the amplifier of FIG. 15A will be described in detail.

As shown in FIG. 15A, the source follower type amplifier comprises a first transistor 85 which is an enhancement transistor and a second transistor 86 which is also an enhancement transistor and which is connected in series to the first transistor 85. The gate of the first transistor 85 is connected to the third node 72 (FIGS. 6 to 9) to receive input voltage $V_{ai}$. The source of the first transistor 85 delivers the output voltage $V_{out}$. The gate of the second transistor 86 is connected to receive the DC bias voltage $V_B$.

In the source follower type amplifier of FIG. 15B, the depletion transistor whose gate receives the input voltage $V_{ai}$, and which corresponds to the first transistor 85 of the amplifier of FIG. 15A, may be replaced by an enhancement transistor.

Figure 16:
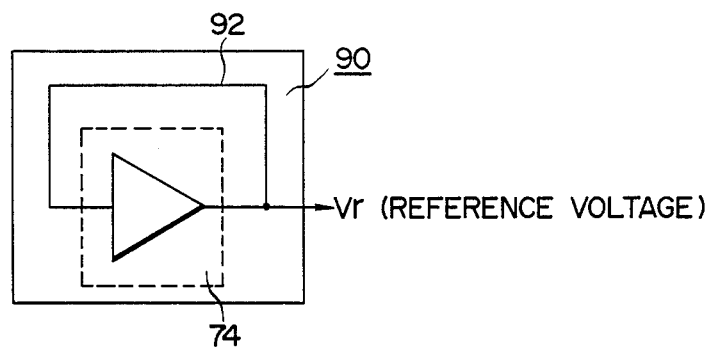
FIG. 16 schematically shows a reference voltage generator which may be used in the circuits of FIGS. 6 to 9.

FIG. 16 shows a circuit 90 for generating reference voltage $V_r$. The circuit 90 comprises an amplifier of the same structure as the amplifier 74 and a feedback path 92 for feeding the output of the amplifier back to the input of the amplifier. The circuit 90 can change the input offset voltage to 0 V. The output voltage of the circuit 90, i.e., reference voltage $V_r$, is equal to the voltage of the operating point $V_{op}$.

Figure 17A:
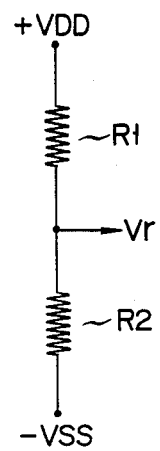
FIG. 17A through FIG. 17C are circuit diagrams of reference voltage generators which may be used in the circuits of FIGS. 6 to 9.
Figure 17B:
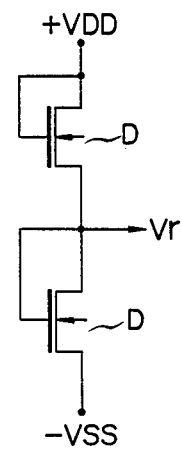
Figure 17C:
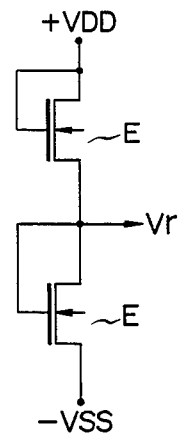

FIGS. 17A to 17C show reference voltage generating circuits which are used when the amplifier 74 has a low gain or is a source follower type amplifier. All these circuits are well known in the art. The circuit of FIG. 17A, for example, is a voltage divider which consists of a series circuit of resistors R1 and R2. The junction point between the resistors R1 and R2 is to deliver reference voltage $V_r$. Any of the circuits shown in FIGS. 17A to 17C can operate even if its input DC voltage varies due to the low gain of the amplifier 74.

As described above, according to the present invention, the difference between two input voltages is amplified and then held by the holding means. Hence, the output voltage of the voltage comparator circuit has an ideal curve even if a high frequency sampling clock signal is used. The low frequency voltage gain of the circuit can therefore be maintained. The low frequency voltage gain is not influenced by the sampling frequency, unlike that of the conventional voltage comparator circuit. The circuit of the invention can more reliably compare the input voltages. The voltage comparator circuit according to the present invention can be reliably used not only in A/D converters and D/A converters, but also in an output circuit for a transversal filter comprised of CCDs with split electrodes.

The present invention is not restricted to the embodiments described above. Various modifications may be realized by those skilled in the art without departing from the technical scope and spirit of the invention. For example, in the circuits of FIGS. 15 and 17, the N-channel MOS transistors may be replaced by P-channel MOS transistors.

What is claimed is:

1. A voltage comparator circuit comprising:
a first amplifier;
first and second transistor switching means for switching first and second input voltages, said first and second transistor switching means each having a current path, each of said current paths having first and second ends, said first ends receiving first and second input voltages, respectively, and said second ends being connected to each other to define a first node, said first and second transistor switching means each having at least one gate receiving at least one of first and second clock signals, said first and second transistor switching means alternatively delivering the first and second input voltages to said first node in synchronism with said first and second clock signals, respectively;
generating and delivering means for generating and delivering an operating point voltage to a first capacitive element, including an operating point voltage generator and a third transistor switching means having at least one gate and a current path, said current path of said third transistor switching means being connected between said operating point voltage generator and said first capacitive element, said first capacitive element being connected between said third transistor switching means and said first node, and said third transistor switching means delivering said operating point voltage to said first capacitive element in synchronism with said first clock signal; and
holding means for holding a difference voltage, said holding means including a second capacitive element, a fourth transistor switching means having a current path and at least one gate, a second node defining the junction between the current path of said third transistor switching means and said first capacitive element, said current path of said fourth transistor switching means being connected between said second capacitive element and said second node, and said second capacitive element being connected between said fourth transistor switching means and ground potential, said holding means holding said difference voltage between said first and second input voltages and applying said difference voltage to said first amplifier in synchronism with said second clock signal.

2. A voltage comparator circuit according to claim 1, wherein said operating point voltage generator comprises a second amplifier having an input terminal and an output terminal, said second amplifier having the same structure as said first amplifier and having its input terminal connected to its output terminal.

3. A voltage comparator circuit according to claim 1, wherein said first amplifier comprises an FET source follower circuit having a gate and a source, said gate receiving said difference voltage held by said holding means, and said source delivering an amplified signal proportional to said difference voltage.

4. A voltage comparator circuit according to claim 1, wherein said first, second, third and fourth transistor switching means comprise field effect transistors of the same channel type.

5. A voltage comparator circuit according to claim 1, wherein said first, second, third and fourth transistor switching means are CMOS field effect transistors.

6. A voltage comparator circuit according to claim 1, wherein said first amplifier includes an inverter comprising a depletion type field effect transistor having a current path and a gate, and an enhancement type field effect transistor having a current path and a gate, said enhancement type field effect transistor being connected to a junction between said fourth transistor means and said second capacitive element to receive said difference voltage through said gate of said enhancement type field effect transistor, said current path of said depletion type field effect transistor being connected in series to the current path of said enhancement type field effect transistor.

* * * * *